(12) United States Patent
Sakamoto

(10) Patent No.: US 7,880,273 B2
(45) Date of Patent: Feb. 1, 2011

(54) METHOD OF MANUFACTURING SEMICONDUCTOR DEVICE FROM SEMICONDUCTOR WAFER

(75) Inventor: Kenichi Sakamoto, Fukuoka (JP)

(73) Assignee: Renesas Electronics Corporation, Kanagawa (JP)

( * ) Notice: Subject to any disclaimer, the term of this patent is extended or adjusted under 35 U.S.C. 154(b) by 590 days.

(21) Appl. No.: 11/543,083

(22) Filed: Oct. 5, 2006

(65) Prior Publication Data

US 2007/0082298 A1    Apr. 12, 2007

(30) Foreign Application Priority Data

Oct. 7, 2005   (JP) .................. 2005-294926

(51) Int. Cl.
  *G03F 7/26*  (2006.01)
(52) U.S. Cl. .............. 257/620; 257/E23.179; 257/E21.523; 430/311; 430/312; 430/313
(58) Field of Classification Search ......... 257/620, 257/E23.179; 430/311, 312, 313; 438/460–465
See application file for complete search history.

(56) References Cited

U.S. PATENT DOCUMENTS

| | | | | | |
|---|---|---|---|---|---|
| 5,024,970 | A | * | 6/1991 | Mori | 438/462 |
| 5,362,585 | A | * | 11/1994 | Adams | 430/30 |
| 5,532,520 | A | * | 7/1996 | Haraguchi et al. | 257/797 |
| 5,633,173 | A | * | 5/1997 | Bae | 438/16 |
| 5,824,457 | A | * | 10/1998 | Liu et al. | 430/394 |
| 5,981,119 | A | * | 11/1999 | Adams | 430/30 |
| 5,998,068 | A | * | 12/1999 | Matsuoka | 430/5 |
| 6,132,910 | A | * | 10/2000 | Kojima | 430/22 |
| 6,577,020 | B2 | * | 6/2003 | Huang et al. | 257/797 |
| 6,936,525 | B2 | * | 8/2005 | Nishiyama et al. | 438/464 |
| 7,087,452 | B2 | * | 8/2006 | Joshi et al. | 438/68 |
| 7,205,636 | B2 | * | 4/2007 | Koike | 257/620 |
| 7,265,567 | B2 | * | 9/2007 | Quinton et al. | 324/763 |
| 7,368,302 | B2 | * | 5/2008 | Greco | 438/5 |
| 2001/0049179 | A1 | * | 12/2001 | Mori | 438/461 |
| 2002/0019091 | A1 | * | 2/2002 | Kim | 438/239 |
| 2002/0052091 | A1 | * | 5/2002 | Holscher et al. | 438/401 |
| 2003/0071369 | A1 | * | 4/2003 | Huang et al. | 257/797 |
| 2003/0209812 | A1 | * | 11/2003 | Nin | 257/797 |
| 2004/0155318 | A1 | * | 8/2004 | Gamini et al. | 257/620 |
| 2004/0212047 | A1 | * | 10/2004 | Joshi et al. | 257/620 |
| 2004/0219443 | A1 | * | 11/2004 | Spears | 430/30 |

(Continued)

FOREIGN PATENT DOCUMENTS

JP        09-50945 A      2/1997

*Primary Examiner*—Leonardo Andújar
*Assistant Examiner*—William Harriston
(74) *Attorney, Agent, or Firm*—Sughrue Mion, PLLC

(57) ABSTRACT

In a method of manufacturing a semiconductor device, a semiconductor wafer is provided. The wafer has semiconductor chip regions, a scribing line region and a predetermined region. A passivation layer is formed on the wafer. A photoresist film is formed on the passivation layer. A first pattern in a reticle is transferred to a first portion of the photoresist film above the scribing line region. The first pattern is transferred to a second portion of the photoresist film above the predetermined region. The photoresist film is developed. The passivation layer is etched using the photoresist film as a mask. The wafer is diced along the scribing line region to form semiconductor chips and a piece. Each of the semiconductor chips corresponds to each of chip regions. The piece group includes a piece which corresponds to the predetermined region.

11 Claims, 9 Drawing Sheets

U.S. PATENT DOCUMENTS

| | | | |
|---|---|---|---|
| 2004/0238973 A1* | 12/2004 | Wakisaka et al. | 257/796 |
| 2005/0112474 A1* | 5/2005 | Sandstrom | 430/5 |
| 2005/0224920 A1* | 10/2005 | Onuma | 257/620 |
| 2005/0269702 A1* | 12/2005 | Otsuka | 257/750 |
| 2006/0214294 A1* | 9/2006 | Fukasawa | 257/738 |
| 2006/0267617 A1* | 11/2006 | Quinton et al. | 324/763 |
| 2007/0027567 A1* | 2/2007 | Lin et al. | 700/121 |
| 2007/0048678 A1* | 3/2007 | Chen et al. | 430/394 |

* cited by examiner

METHOD OF MANUFACTURING SEMICONDUCTOR DEVICE FROM SEMICONDUCTOR WAFER

BACKGROUND OF THE INVENTION

1. Field of the Invention

The present invention relates to a semiconductor device and a semiconductor wafer.

2. Description of the Related Art

FIG. 1 is a plan view showing a portion of a conventional semiconductor wafer. FIG. 1 shows a plurality of semiconductor chips 101 and a mirror chip 102 in the wafer. Each of the plurality of semiconductor chips 101, which are hatched in FIG. 1, is a normal semiconductor chip. The normal semiconductor chip indicates that it is an object of selection for assembly. On the other hand, the mirror chip 102 is a defective semiconductor chip by nature since the mirror chip 102 is arranged at the periphery of the wafer and since the circuits in the mirror chip 102 are not wired. In each of the plurality of semiconductor chips 101, a wiring pattern of an aluminum film is formed by etching. In the mirror chip 102, there is an aluminum film, which remains to be intact or remains not to be etched. Each of the wiring pattern of the aluminum film and the intact aluminum film in the mirror chip 102 is covered with a passivation layer.

In probing of the water, a file of data, which indicates the test result for each of the plurality of semiconductor chips 101 and the position of each of the plurality of semiconductor chips 101 and the mirror chip 102, is generated. After dicing of the wafer, mounting apparatus carries out wafer alignment. In wafer alignment, the mounting apparatus detects the mirror chip 102 by image recognition and relates the plurality of semiconductor chips 101 and the file of data using the mirror chip 102 as a benchmark of the position. Then, the mounting apparatus picks up good chips among the plurality of semiconductor chips 101 based on the file of data. The good chips are packaged to form semiconductor devices.

Japanese Laid Open Patent Application (JP-A-Heisei, 9-50945) discloses a technique to add an identification mark to the mirror chip 102 for easier detection of the mirror chip 102 by image recognition. The identification mark is added to the mirror chip 102 by patterning the aluminum film in the mirror chip 102, printing the identification mark on the mirror chip 102 or affixing a seal on the mirror chip 102.

In case of the structure shown in FIG. 1, the wiring pattern of the aluminum film is formed in each of the plurality of semiconductor chips 101. On the other hand, there is the intact aluminum film in the mirror chip 102. But, the brightness of the mirror chip 102 and each of the plurality of semiconductor chips 101 are close to each other, since each of the intact aluminum film and the wiring pattern of the aluminum film is covered with the passivation layer. Thus, it is difficult to distinguish the mirror chip 102 from each of the plurality of semiconductor chips 101 by image recognition. Therefore, the precision of wafer alignment may be poor.

In case of the technique disclosed in Japanese Laid Open Patent Application (JP-A-Heisei, 9-50945), the yield of the semiconductor devices may be reduced by the contamination of the plurality of semiconductor chips 101 with fragments of aluminum produced in the patterning of the aluminum film in the mirror chip 102. Moreover, a reticle for the patterning of the aluminum film in the mirror chip 102 adds more cost. Also, automated apparatus for printing the identification mark or affixing the seal adds more cost. Printing the identification mark or affixing the seal by hand may cause human error such as adding the identification mark to a wrong chip, resulting in the poor precision of wafer alignment.

SUMMARY OF THE INVENTION

In an aspect of the present invention, a method of manufacturing a semiconductor device, includes:

providing a semiconductor wafer having a plurality of semiconductor chip regions, a scribing line region and a predetermined region;

forming a passivation layer on the semiconductor wafer;

forming a photoresist film on the passivation layer;

exposing a first portion of the photoresist film above the scribing line region to light passed through a reticle to transfer a first pattern in the reticle to the first portion of the photoresist film;

exposing a second portion of the photoresist film above the predetermined region to light passed through the reticle to transfer the first pattern to the second portion of the photoresist film;

developing the photoresist film after the exposing the first portion of the photoresist film and after the exposing the second portion of the photoresist film;

etching the passivation layer using the photoresist film as a mask after the developing to form a first opening in the scribing line region and a second opening in the predetermined region; and dicing the semiconductor wafer along the scribing line region after the etching to form a plurality of semiconductor chips and a piece group, wherein each of the semiconductor chips corresponds to each of the plurality of chip regions, and the piece group includes a piece which corresponds to the predetermined region.

In the method of manufacturing a semiconductor device, the second opening, which corresponds to the first pattern, is formed in a portion of the passivation layer on the predetermined region. The pattern of the second opening can be used to carry out wafer alignment, since the pattern of the second opening does not disappear in dicing of the semiconductor wafer. Moreover, an additional reticle to form the pattern of the second opening is not required besides the reticle used for exposing the first portion of the photoresist film. Therefore, the wafer alignment can be carried out precisely without an additional cost for the additional reticle.

In another aspect of the present invention, a semiconductor wafer which includes a passivation layer, includes:

a plurality of semiconductor chip regions each of which corresponds to each of plurality of semiconductor chips;

a region of scribing lines along which the semiconductor wafer is cut when the semiconductor wafer is diced; and an another region, wherein a first opening and a second opening is formed in the passivation layer, the first opening is arranged in the region of scribing lines, a pattern of the first opening is identical to a pattern of the region of scribing lines, the second opening is arranged in the another region, and a pattern of the second opening is identical to a portion of the pattern of the first opening.

In the semiconductor wafer thus constructed, the pattern of the second opening can be used to carry out wafer alignment, since the pattern of the second opening does not disappear in dicing of the semiconductor wafer. Moreover, an additional reticle to form the second opening is not required besides a reticle used to form the first opening. Therefore, the wafer alignment can be carried out precisely without an additional cost for the additional reticle.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

An embodiment of the present invention and variation s of the embodiment will be described below with reference to the accompanying drawings. By the way, in the explanation of the drawings, the same symbols are assigned to the same components, and the duplex explanations are omitted.

Figure 1:
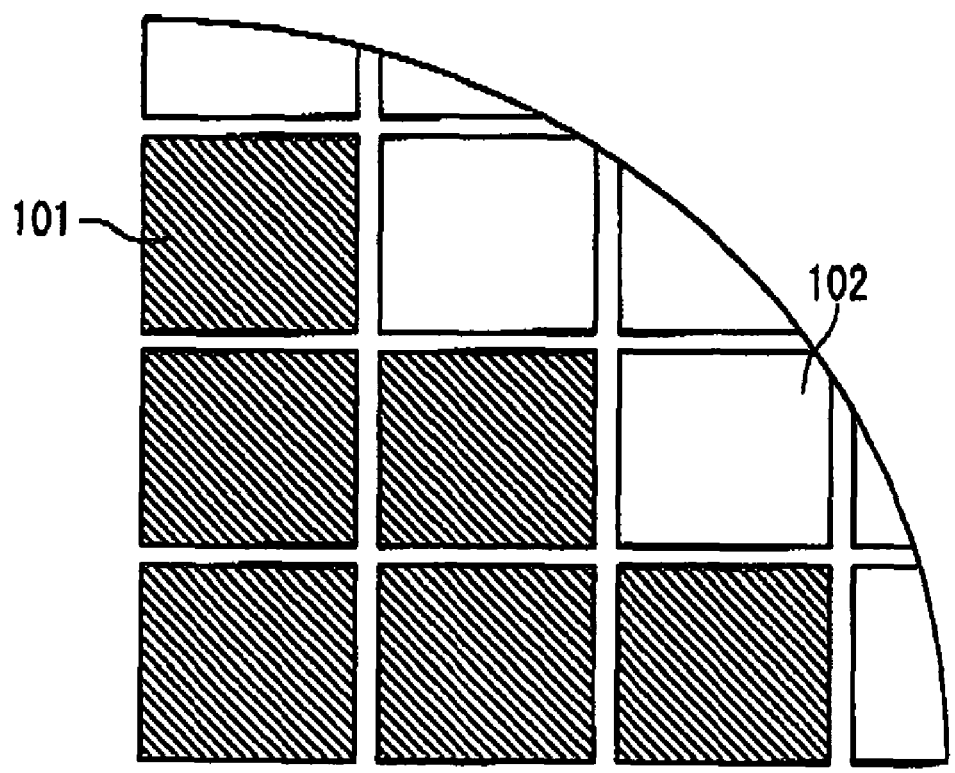
FIG. 1 shows a plan view of a conventional semiconductor wafer.
Figure 2:
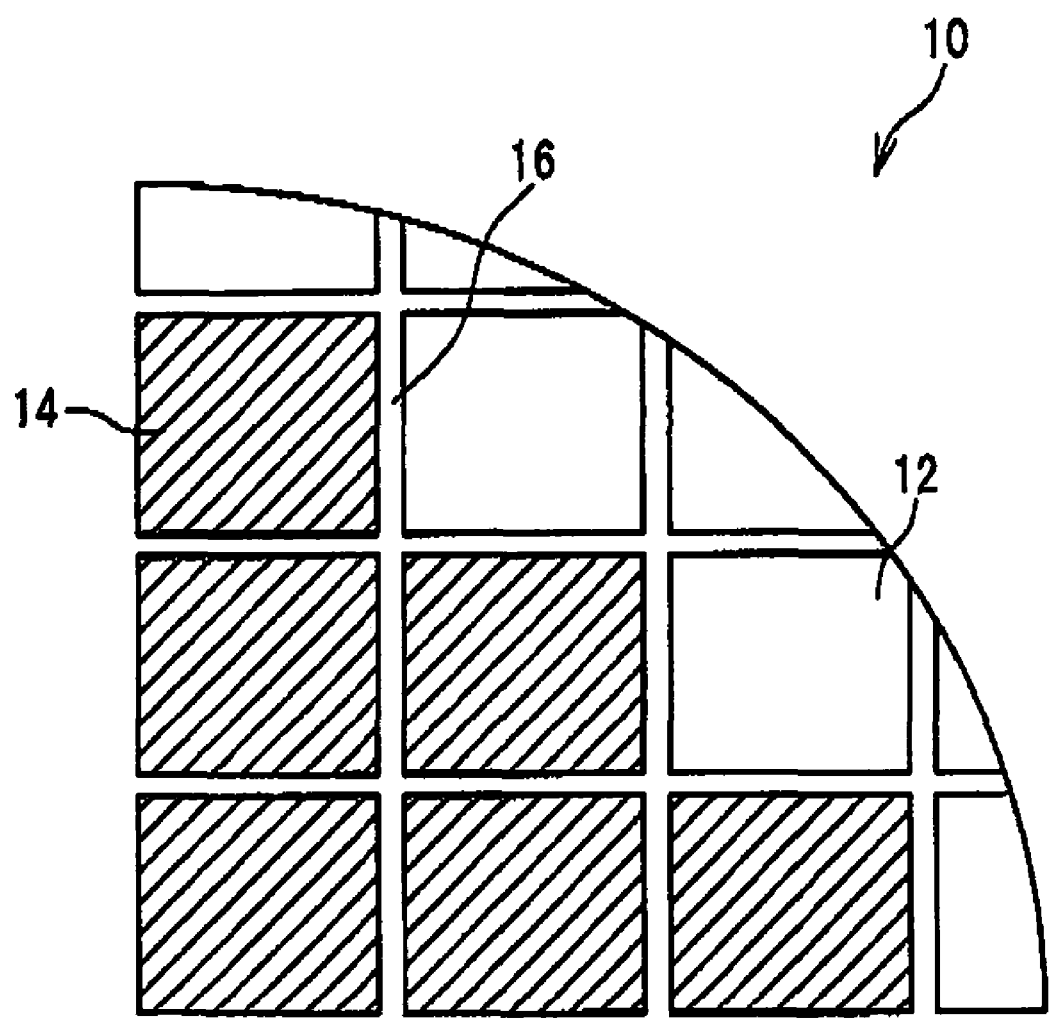
FIG. 2 shows a plan view of a semiconductor wafer according to an embodiment of the present invention.

The embodiment of the present invention will be described below with reference to FIGS. 2 to 5. At first, a semiconductor wafer 10 is provided (a providing step). A part of the semiconductor wafer 10 is shown in FIG. 2. The semiconductor wafer 10 has a plurality of semiconductor chip regions 14, a mirror chip region 12 and a scribing line region 16. Each of the plurality of semiconductor chip regions 14, which are hatched in FIG. 2, corresponds to a normal semiconductor chip. The normal semiconductor chip indicates that it is an object of selection for assembly. The mirror chip region 12 corresponds to a mirror chip. The mirror chip is a defective semiconductor chip by nature since the mirror chip region 12 is arranged at the periphery of the semiconductor wafer 10 and since the circuits (not shown) in the mirror chip region 12 are not wired. In other words, at least a portion of the mirror chip region 12 reaches the edge of the semiconductor wafer 10. The semiconductor wafer 10 is cut in the scribing line region 16 when the wafer 10 is diced. The semiconductor wafer 10 includes an aluminum film (not shown). In a portion of the aluminum film, which belongs to each of the plurality of semiconductor chip regions 14, a wiring pattern is formed by etching. The other portion of the aluminum film remains to be intact or remains not to be etched.

Next, a passivation layer (not shown) is formed on the aluminum film of the semiconductor wafer 10 (a passivation layer forming step). For example, the passivation layer consists of a silicon oxide film, a silicon nitride film, a silicon oxide film and a polyimide film on it, or, a silicon nitride film and a polyimide film on it. The passivation layer includes a first and a second portion. The first portion of the passivation layer is formed on the scribing line region 16. The second portion of the passivation layer is formed on the mirror chip region 12.

Next, a photoresist film (not shown) is formed on the passivation layer (a photoresist film forming step). The photoresist film includes a first portion and a second portion. The first portion of the photoresist film is formed above the scribing line region 16. The second portion of the photoresist film is formed above the mirror chip region 12.

Figure 3:
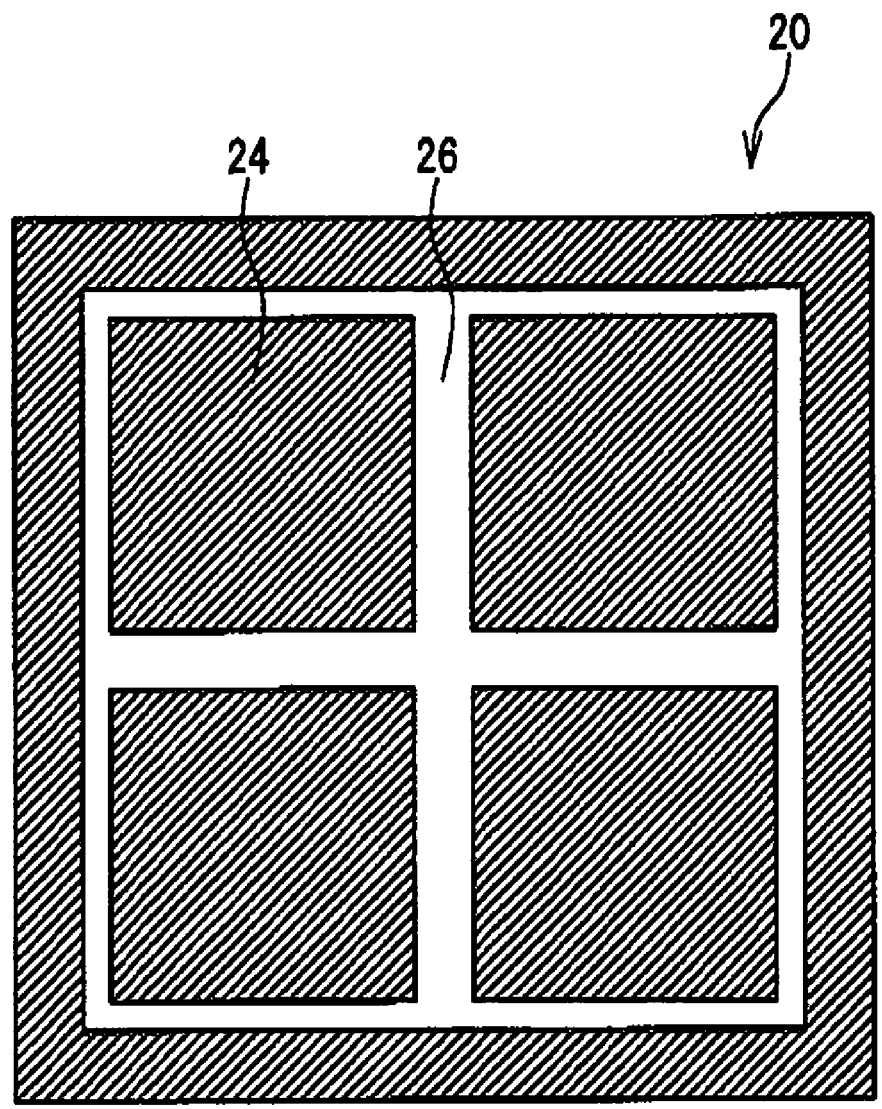
FIG. 3 shows a plan view of a reticle according to the embodiment of the present invention.

Next, a stepper exposes the semiconductor wafer 10 using a reticle 20 shown in FIG. 3 (first and second exposing steps).

As shown in FIG. 3, the reticle 20 contains, for example, four of region 24 and an opening 26. The region 24 corresponds to each of the plurality of semiconductor chip regions 14. Light can not pass through the region 24 except openings (not shown) in the region 24. The openings in the region 24 correspond to bonding pads and testing pads on each of the plurality of semiconductor chip regions 14. The opening 26, through which light can pass, corresponds to a portion of the scribing line region 16.

The stepper exposes the first portion of the photoresist film above the scribing line region 16 to light passed through the reticle 20 (the first exposing step). In the first exposing step, the stepper transfers repeatedly the pattern of the opening 26 to the first portion of the photoresist film.

Figure 4:
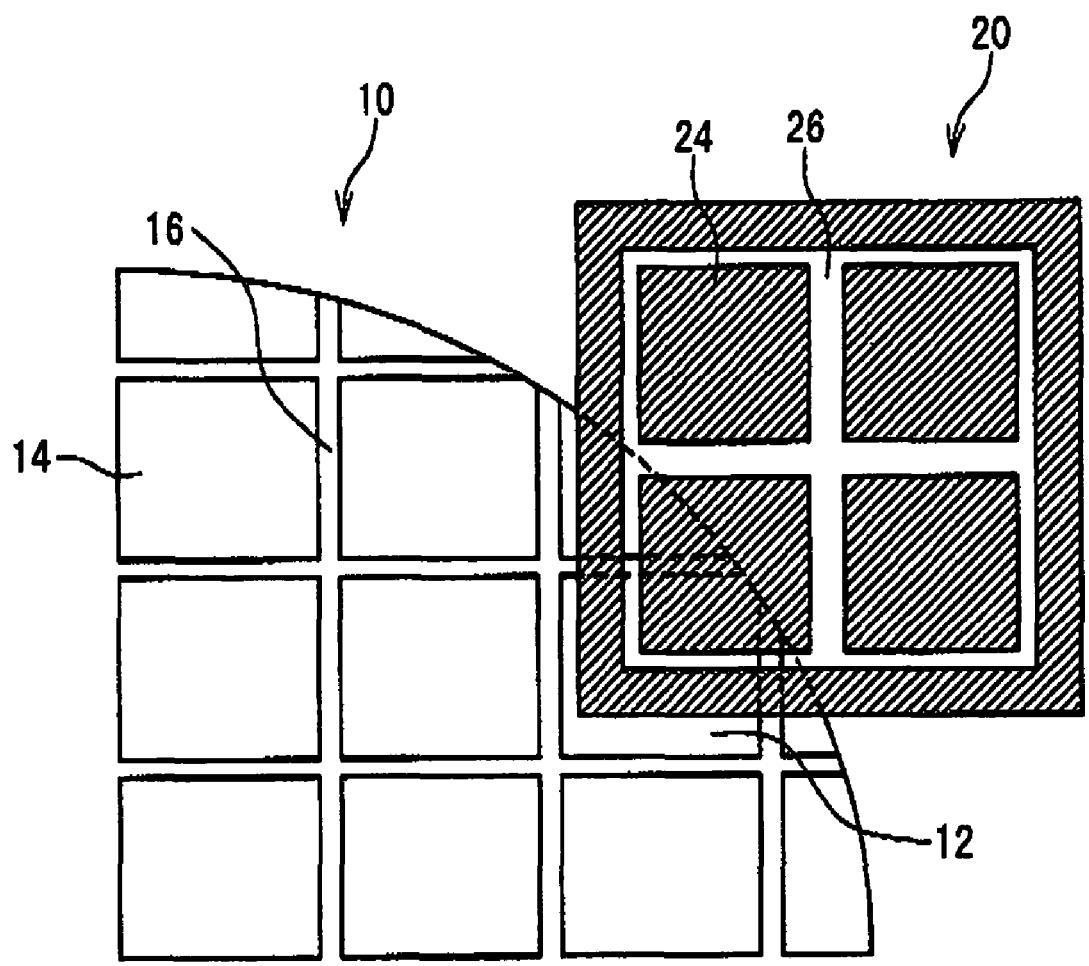
FIG. 4 shows an arrangement of the semiconductor wafer and the reticle in second exposing step according to the embodiment of the present invention.

After the first exposing step, the stepper moves the semiconductor wafer 10 by a distance of AX in x direction and by a distance of BY in y direction to arrange the semiconductor wafer 10 and the reticle 20 as shown in FIG. 4 (a moving step). The symbol AX denotes the pitch X of chip in x direction multiplied by a real number A, which is not identical to any of integers. The symbol BY denotes the pitch Y of chip in y direction multiplied by a real number B, which is not identical to any of integers. For example, each of the real number A and B is a half integer.

Next, the stepper exposes the second portion of the photoresist film above the mirror chip region 12 to light passed through the reticle 20 to transfer a portion of the pattern of the opening 26 to the second portion of the photoresist film (the second exposing step).

Next, the photoresist film is developed (a developing step).

Next, the passivation layer is etched using the photoresist film as a mask (an etching step).

Next, the photoresist film is removed from the semiconductor wafer 10 (a removing step).

Figure 5:
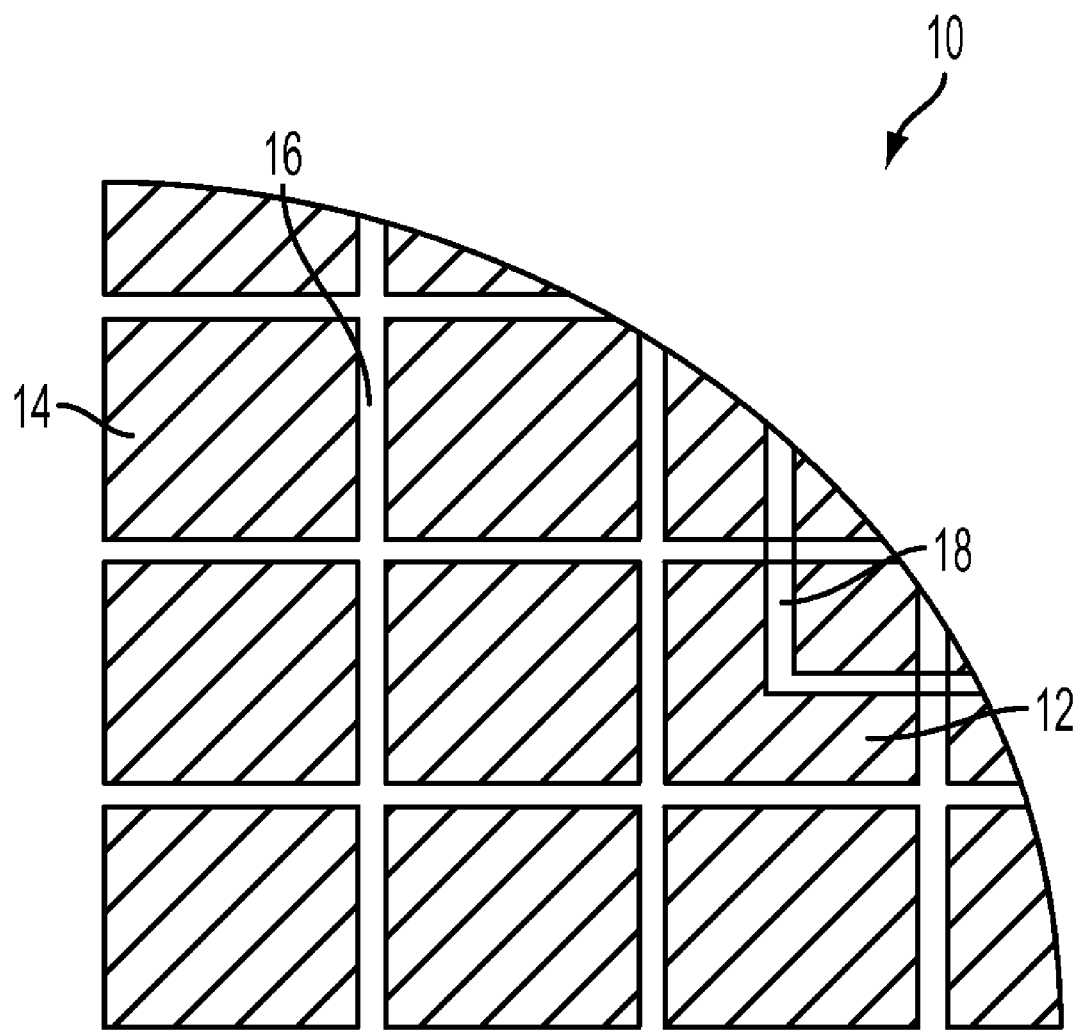
FIG. 5 shows a plan view of the semiconductor wafer after removing step according to the embodiment of the present invention.

FIG. 5 shows the semiconductor wafer 10 after the removing step. There is a pattern on the scribing line region 16. The pattern on the scribing line region 16 is identical to the pattern of scribing line region 16. The pattern on the scribing line region 16 is the consequence of removal of the first portion of the passivation layer (identified with hatch marks in FIG. 5) in the etching step. Moreover, a pattern 18, which is L-letter shape, is added to the mirror chip region 12. The pattern 18 is identical to a portion of the pattern on the scribing line region 16. The pattern 18 and the pattern on the scribing line region 16 are openings in the passivation layer from which the aluminum film underlying the passivation layer is exposed.

After the removing step, each of the plurality of semiconductor chip regions 14 is probed (a probing step). In the probing step, a file of data, which indicates the test result for each of the plurality of semiconductor chip regions 14 and the position of each of the plurality of semiconductor chip regions 14 and the mirror chip region 12, is generated.

Next, the semiconductor wafer 10 is diced along the scribing line region 16 to form a plurality of semiconductor chips, the mirror chip and other pieces (a dicing step). Each of the plurality of semiconductor chips corresponds to each of the plurality of semiconductor chip regions 14. The mirror chip corresponds to the mirror chip region 12. By the way, the scribing line region 16 shows a pattern of scribing lines forming rectangles. Therefore, dicing the semiconductor wafer 10 along the scribing line region 16 means dicing the wafer 10 along the scribing lines. Each of the plurality of semiconductor chips is the normal semiconductor chip. Since there is the opening in the passivation layer on the scribing line region 16, the semiconductor wafer 10 is easily diced. Also, the production of a broken chip is prevented.

After the dicing step, mounting apparatus carries out wafer alignment (a wafer alignment step). In the water alignment step, the mounting apparatus detects the mirror chip by image recognition and relates the plurality of semiconductor chips and the file of data, which is generated in the probing step, using the mirror chip as a benchmark of the position.

After that, the mounting apparatus picks up good chips among the plurality of semiconductor chips based on the file of data (a picking up step). In other words, in the picking up step, the mounting apparatus picks up each of the good chips based on the positions of each of the good chips and the mirror chip. The good chips are packaged to form semiconductor devices.

Effects of the embodiment will be described below.

In the mirror chip, the aluminum film is exposed from the pattern 18. In each of the plurality of semiconductor chips, the aluminum film is covered with the passivation layer. The brightness of the mirror chip is largely different from that of each of the plurality of semiconductor chips. Accordingly, the mounting apparatus can detect the mirror chip without mistake by the image recognition. In other words, it is prevented that one of the plurality of semiconductor chips adjacent to the mirror chip is detected as the mirror chip. Thus, a good precision of the wafer alignment is attained. The good precision of the wafer alignment prevents the mounting apparatus from picking up a defective chip as one of the good chips, resulting in the improvement of the manufacturing yield of the semiconductor devices.

Moreover, an additional reticle and an additional lithography process to form the pattern 18 are not required besides the reticle 20 and a lithography process to form the opening in the passivation layer on the scribing line region 16. Thus, an additional cost is not required. Also, a decrease in shots increases the throughput of the stepper.

The pattern 18, from which the aluminum film is exposed, can be formed at the same position in semiconductor wafers. Thus, a worker can easily recognize the pattern 18 from the appearance of the semiconductor wafer 10. Therefore, the worker can easily set a start point for the mounting apparatus when the mounting apparatus is in normal operation and can easily reset the start point when the mounting apparatus is in trouble.

The pattern 18 is added not to any of the plurality of semiconductor chip regions 14 but to the mirror chip region 12. Thus, any of the plurality of semiconductor chip regions 14 is not wasted by adding the pattern 18 thereto.

Figure 6:
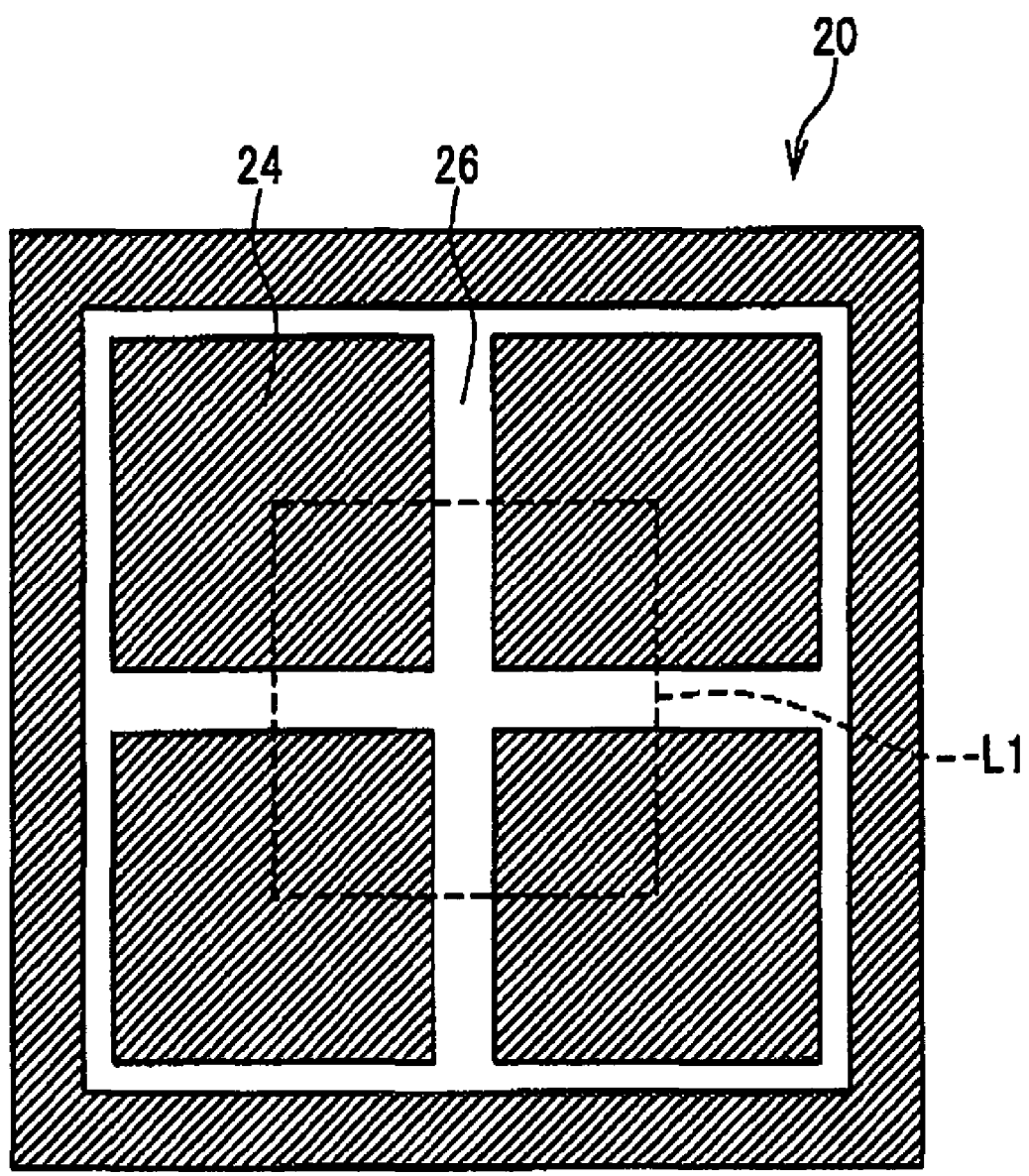
FIG. 6 shows patterns in the reticle to be transferred and not to be transferred to the semiconductor wafer in second exposing step according to a first variation of the embodiment of the present invention.
Figure 7:
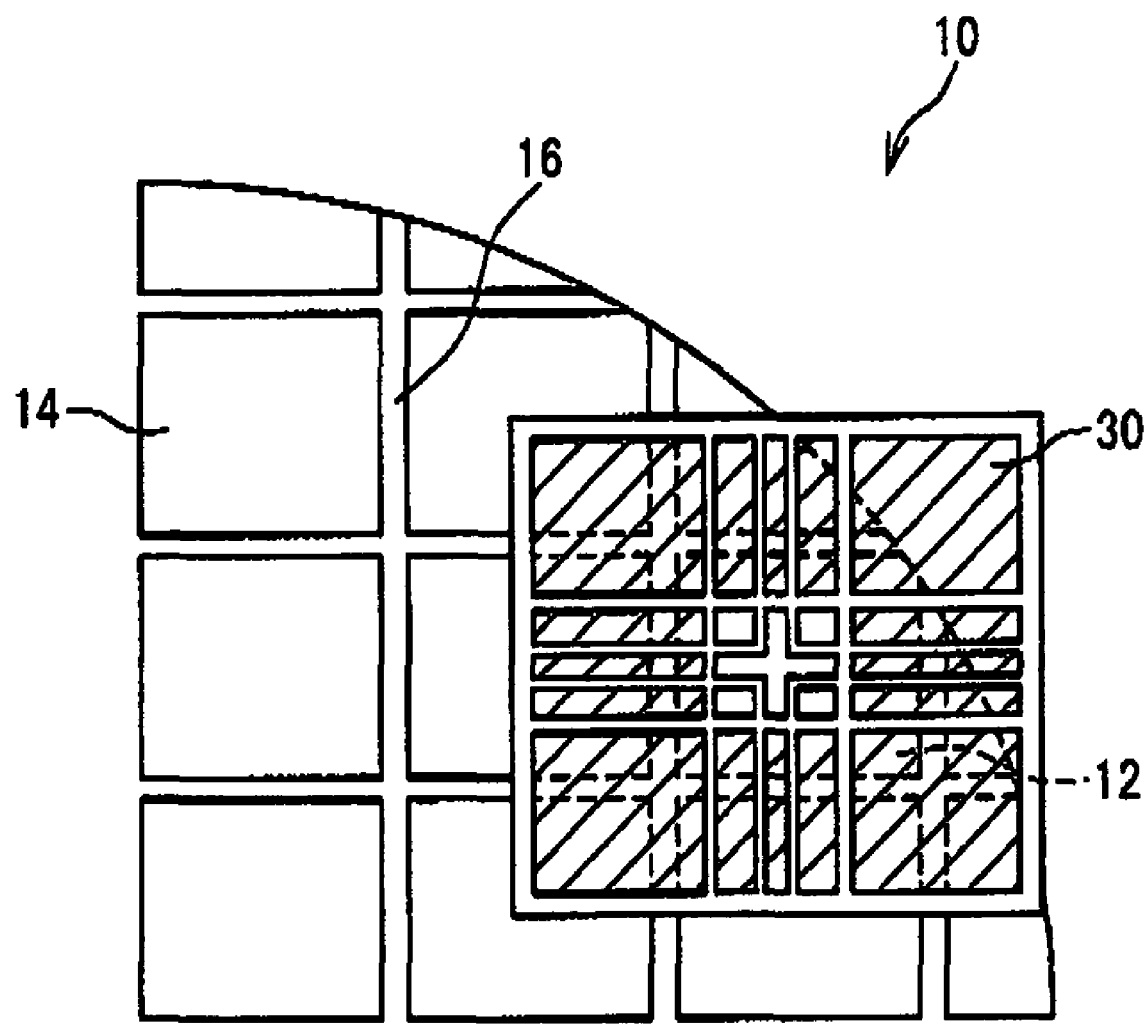
FIG. 7 shows an arrangement of the semiconductor wafer and a blind in second exposing step according to the first variation of the embodiment of the present invention.
Figure 8:
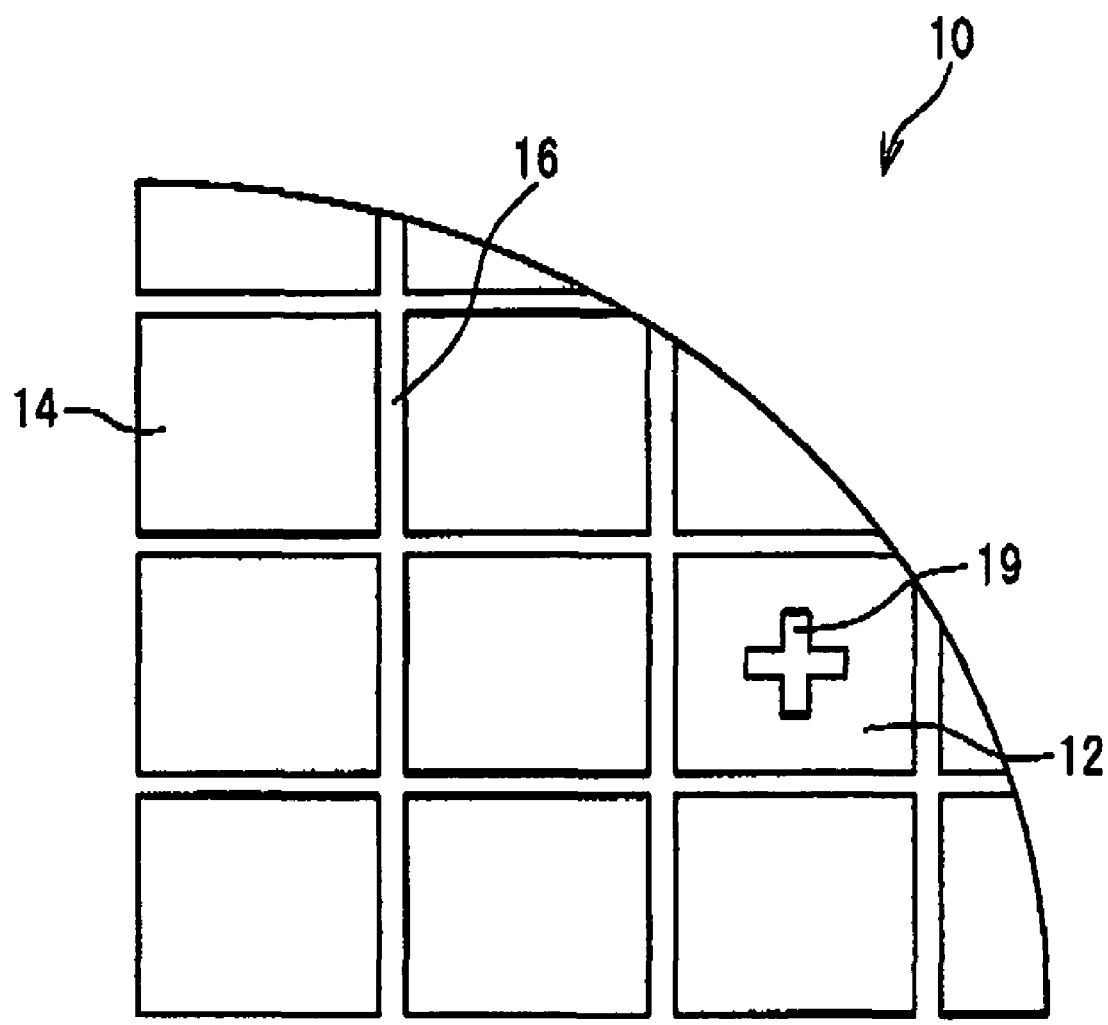
FIG. 8 shows a plan view of the semiconductor wafer after removing step according to the first variation of the embodiment of the present invention.

A first variation of the embodiment will be described below with reference to FIGS. 6 to 8. As shown in FIG. 6, the opening 26 contains a cross pattern, which is shown inside a box L1, and the other pattern, which is shown outside the box L1. The stepper has a blind 30. In the second exposure step, the stepper arranges the blind 30 and the semiconductor wafer 10 as shown in FIG. 7. Then, the stepper exposes the second portion of the photoresist film above the mirror chip region 12 to light passed through the reticle 20 to transfer the cross pattern while preventing the other pattern to be transferred to the photoresist film with the blind 30. Consequently, a cross pattern 19, which corresponds to the cross pattern of the opening 26, is formed in the second portion of the passivation layer on the mirror chip region 12, as shown in FIG. 8. The cross pattern 19 is an opening in the second portion of the passivation layer and is identical to a portion of the pattern on the scribing line region 16. Thus, the blind 30 can prevent an unnecessary exposure on any of the plurality of semiconductor chip regions 14.

Figure 9:
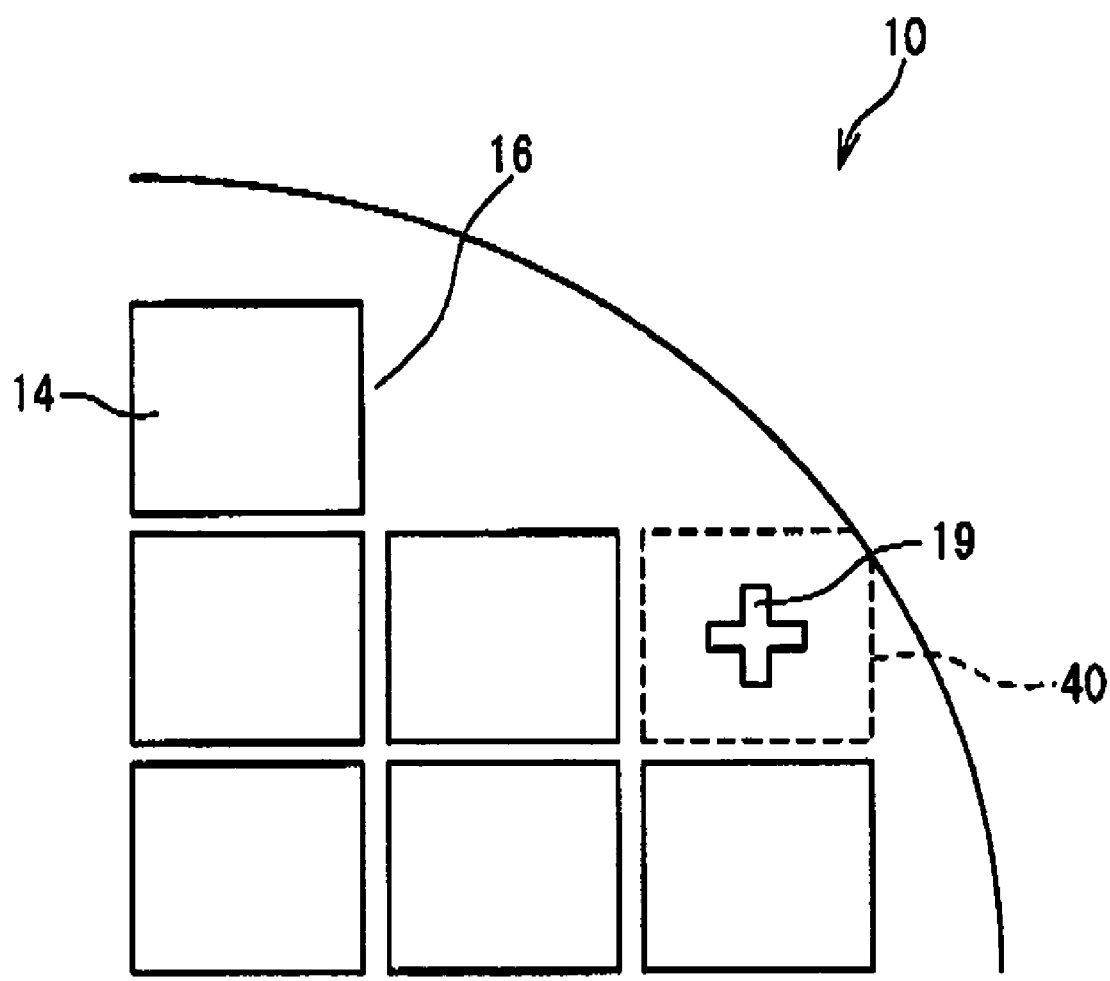
FIG. 9 shows a plan view of the semiconductor wafer after removing step according to a second variation of the embodiment of the present invention.

A second variation of the embodiment will be described below with reference to FIG. 9. In the second variation of the embodiment, the semiconductor wafer has a marking region 40 in place of the mirror chip region 12. The passivation layer includes a third portion on the marking region 40. The cross pattern 19 is formed in the third portion of the passivation layer. The marking region 40 corresponds to one of other pieces which are formed in the dicing step. In other words, the marking region 40 is a piece other than the normal semiconductor chip or the mirror chip. Also in this case, the intact aluminum film underlying the passivation layer is exposed from the cross pattern 19. A reflected light on the intact aluminum film has a characteristic of a light reflected on a metal surface. Accordingly, the cross pattern 19 can be recognized with ease. Moreover, a decrease in shots increases the throughput of the stepper.

In a third variation of the embodiment, the photoresist film is photosensitive polyimide film, and, the passivation layer consists of a silicon oxide film or a silicon nitride film. In this case, the removing step is not required.

It is apparent that the present invention is not limited to the above embodiment, but may be modified and changed without departing from the scope and spirit of the invention.

What is claimed is:

1. A semiconductor wafer which includes a passivation layer, comprising:
  a plurality of semiconductor chip regions each of which corresponds to each of a plurality of semiconductor chips;
  a region of scribing lines along which said semiconductor wafer is cut when said semiconductor wafer is diced; and
  an another region,
  wherein a first opening and a second opening is formed in said passivation layer,
  wherein said first opening is arranged in said region of scribing lines,
  wherein a pattern of said first opening is identical to a pattern of said region of scribing lines,
  wherein said second opening is arranged in said another region,
  wherein a pattern of said second opening is identical to a portion of said pattern of said first opening,
  wherein said another region is a region other than said region of said scribing lines, and
  wherein said another region does not overlap with said region of said scribing lines.

2. The semiconductor wafer according to claim 1, wherein said another region corresponds to a semiconductor chip, and wherein said another region is arranged at a periphery of said semiconductor wafer.

3. The semiconductor wafer according to claim 1, wherein said another region corresponds to a region other than a semiconductor chip.

4. The semiconductor wafer according to claim 1, wherein a metal film underlying said passivation layer is exposed from said second opening.

5. The semiconductor wafer according to claim 1, wherein said second pattern of said second opening is a cross pattern.

6. The semiconductor wafer according to claim 1, wherein said second pattern of said second opening is an L-letter pattern.

7. The semiconductor wafer according to claim 1, wherein said passivation layer defines a periphery of said first opening; and
wherein said passivation layer defines a periphery of said second opening.

8. The semiconductor wafer according to claim 1, wherein a width of said pattern of said first opening is identical to a width of said pattern of said region of scribing lines.

9. The semiconductor wafer according to claim 1, wherein said another region is a mirror chip region.

10. The semiconductor wafer according to claim 1, wherein said another region comprises a semiconductor chip that is devoid of wiring patterns.

11. The semiconductor wafer according to claim 1, wherein a width of said pattern of said second opening is identical to a width of said portion of said pattern of said first opening.

* * * * *